United States Patent
Malinin

(10) Patent No.: US 10,153,695 B2
(45) Date of Patent: Dec. 11, 2018

(54) FEEDBACK SCHEME FOR NON-ISOLATED POWER SUPPLY

(71) Applicant: Dialog Semiconductor Inc., Campbell, CA (US)

(72) Inventor: Andrey B. Malinin, Fort Collins, CO (US)

(73) Assignee: Dialog Semiconductor Inc., Campbell, CA (US)

( * ) Notice: Subject to any disclaimer, the term of this patent is extended or adjusted under 35 U.S.C. 154(b) by 0 days.

(21) Appl. No.: 15/628,420

(22) Filed: Jun. 20, 2017

(65) Prior Publication Data
US 2018/0159428 A1  Jun. 7, 2018

Related U.S. Application Data

(63) Continuation of application No. 14/587,416, filed on Dec. 31, 2014, now Pat. No. 9,768,686.

(51) Int. Cl.
*H02M 3/156* (2006.01)
*H02M 1/00* (2006.01)
*G01R 31/40* (2014.01)
*G01R 19/00* (2006.01)

(52) U.S. Cl.
CPC ......... *H02M 3/156* (2013.01); *G01R 19/0084* (2013.01); *G01R 31/40* (2013.01); *H02M 2001/0003* (2013.01); *H02M 2001/0025* (2013.01)

(58) Field of Classification Search
CPC . H02M 2001/0003; H02M 2001/0025; H02M 3/156; H02M 3/1563
See application file for complete search history.

(56) References Cited

U.S. PATENT DOCUMENTS

| | | |
|---|---|---|
| 5,777,512 A | 7/1998 | Tripathi |
| 6,084,450 A | 7/2000 | Smith et al. |
| 7,057,456 B2 | 6/2006 | Taura et al. |
| 8,022,757 B2 | 9/2011 | Takagi et al. |
| 2001/0038542 A1 | 11/2001 | MacKay et al. |
| 2006/0006933 A1 | 1/2006 | Nguyen |
| 2006/0290334 A1 | 12/2006 | Bazes |

(Continued)

FOREIGN PATENT DOCUMENTS

| | | |
|---|---|---|
| DE | 601 01 694 T2 | 12/2004 |
| EP | 1128535 B1 | 1/2004 |

OTHER PUBLICATIONS

German Office Action, German Application No. 102015206258.9, dated Sep. 11, 2015, 10 pages.

(Continued)

*Primary Examiner* — Harry Behm
(74) *Attorney, Agent, or Firm* — Fenwick & West LLP

(57) ABSTRACT

Embodiments described herein describe a switching power converter that includes a switch, an inductor, a diode, and a controller that generates a control signal to turn on and turn off the switch. The controller generates the control signal by generating a reference signal, integrating a difference between a voltage value of the generated reference signal, and a voltage difference between voltage values of the switching node and the second output terminal, and generating the control signal by processing the integrated voltage difference.

20 Claims, 7 Drawing Sheets

(56) References Cited

U.S. PATENT DOCUMENTS

| | | | |
|---|---|---|---|
| 2007/0182392 A1* | 8/2007 | Nishida | H02M 3/156 323/282 |
| 2009/0160418 A1* | 6/2009 | Kawagishi | H02M 3/156 323/311 |
| 2010/0090671 A1 | 4/2010 | Zhang et al. | |
| 2013/0038308 A1* | 2/2013 | Sumitomo | H02M 3/156 323/283 |
| 2013/0257398 A1 | 10/2013 | Srivastava et al. | |

OTHER PUBLICATIONS

German Second Office Action, German Application No. 1 O 2015 206 258.9, dated Apr. 21, 2017, 16 pages.
Korean Office Action, Korean Application No. 10-2015-0189521, dated Feb. 3, 2017, 6 pages. (with concise explanation of relevance).
Smedley, K.M. et al., "One-Cycle Control of Switching Converters," IEEE Transactions on Power Electronics, Nov. 1995, pp. 625-633, vol. 10, No. 6.
United States Office Action, U.S. Appl. No. 14/587,416, dated Mar. 6, 2017, 7 pages.
United States Office Action, U.S. Appl. No. 14/587,416, dated Oct. 17, 2016, 10 pages.
United States Office Action, U.S. Appl. No. 14/587,416, dated Jul. 21, 2016, 10 pages.

* cited by examiner

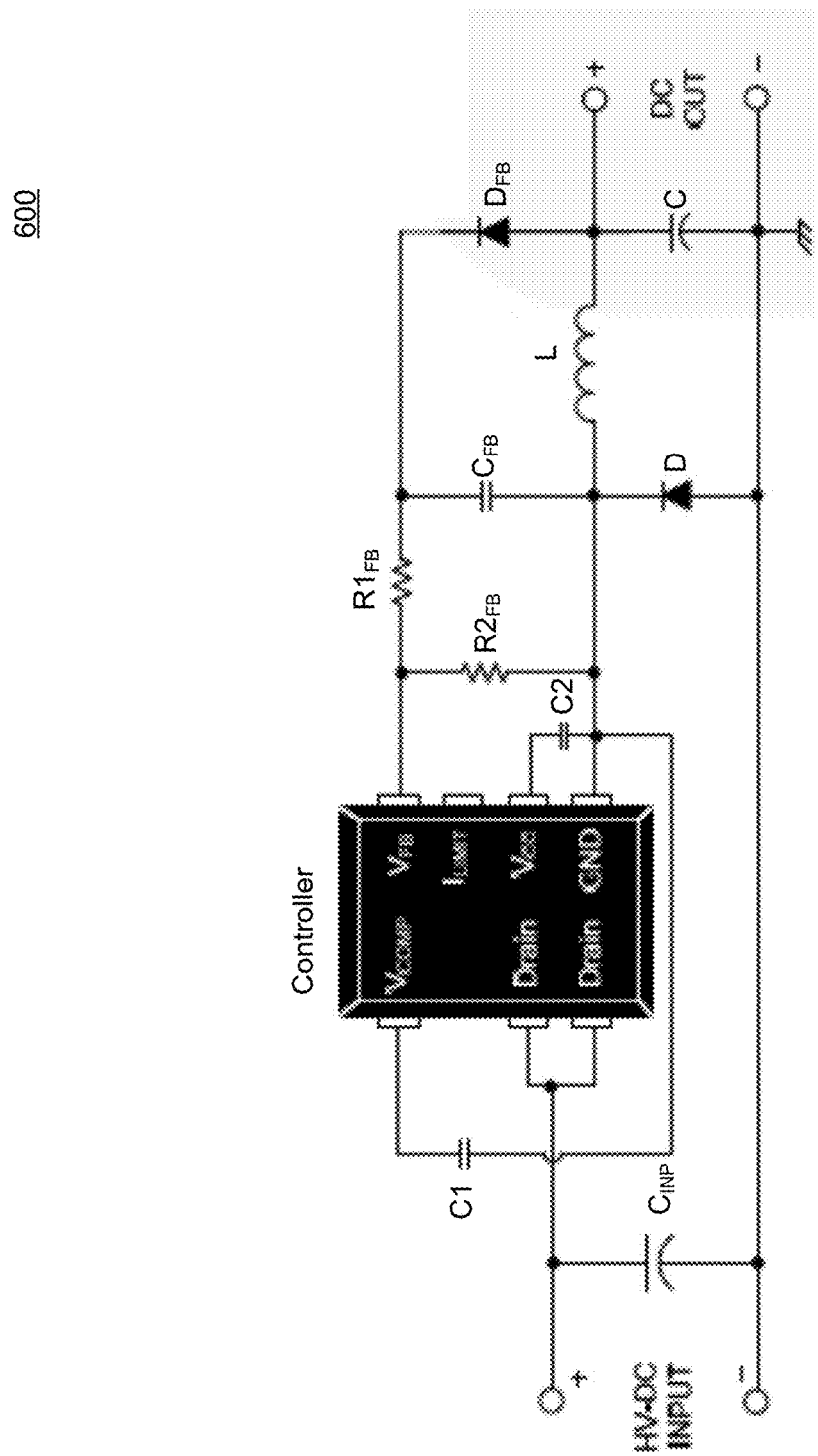
FIG. 6 - Prior Art

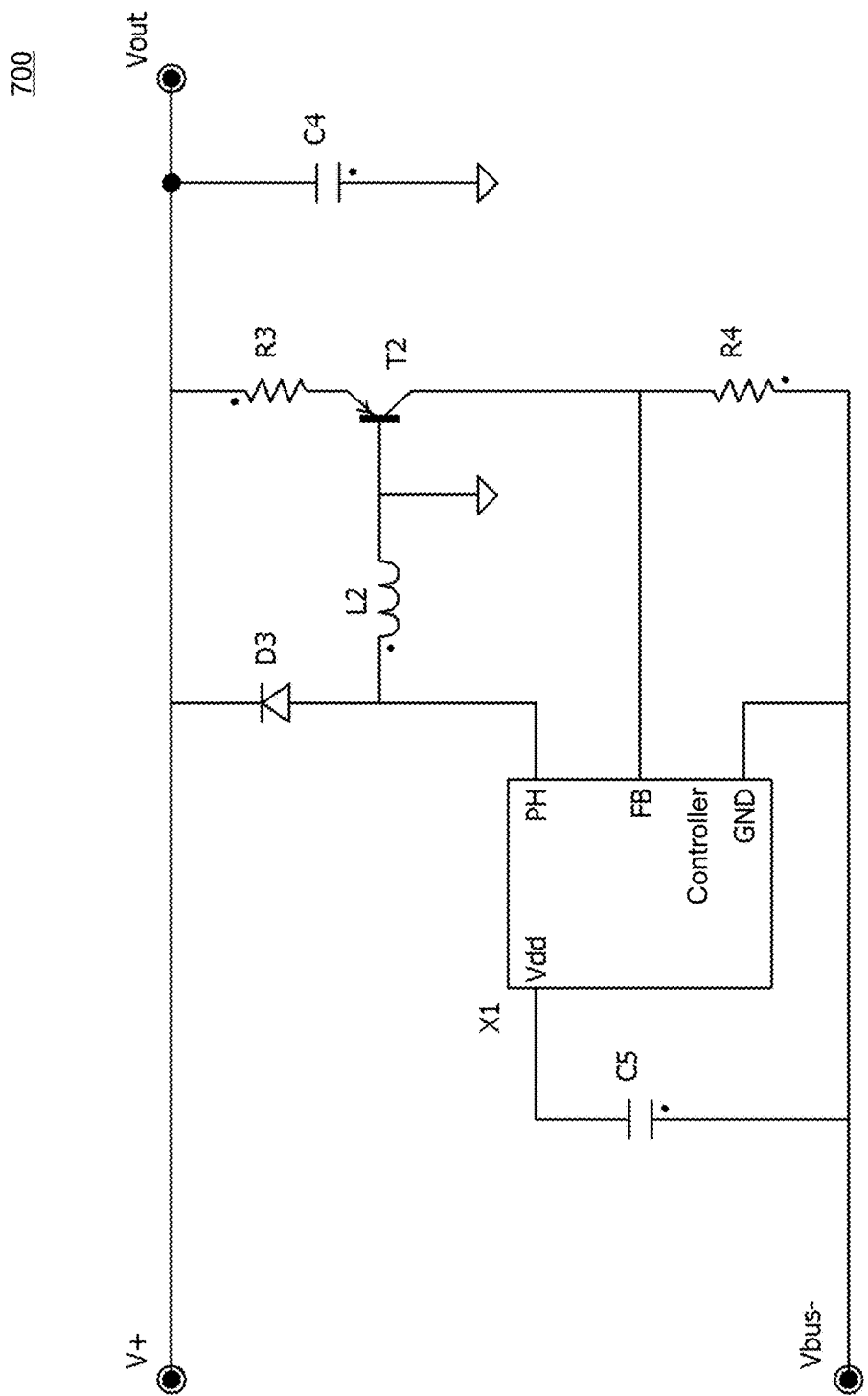
FIG. 7 - Prior Art

FEEDBACK SCHEME FOR NON-ISOLATED POWER SUPPLY

RELATED APPLICATIONS

This application is a continuation of U.S. application Ser. No. 14/587,416 filed on Dec. 31, 2014, now U.S. Pat. No. 9,768,686, which is incorporated by reference herein.

BACKGROUND

Field of the Disclosure

This disclosure generally relates to power supplies, and specifically to a feedback scheme for non-isolated power supplies.

Description of the Related Art

Switching power supplies are categorized into either isolated power supplies or non-isolated power supplies. In isolated power supplies, a transformer is placed between the input and output that provides galvanic isolation between the input and output. Non-isolated power supplies include a single inductor and do not have a galvanic isolation between the input and output. In a non-isolated power supply that operates on high voltages, a high voltage isolation device is typically needed to send the information about the output voltage to control the power switch. For example, a high voltage diode can be used to handle voltages as high as (or higher than to account for switching overshoots) 155V.

A conventional feedback scheme in a high voltage buck converter uses a high voltage diode (e.g., $D_{FB}$ in FIG. 6) or a high voltage bipolar junction transistor (e.g., T2 in FIG. 7)) to send the information about the high output voltage back to a controller that generates a control signal for controlling the power switch. One disadvantage of the conventional approach is the necessity of a high voltage diode (e.g., FIG. 6) or a high voltage BJT (e.g., FIG. 7) that is expensive. Another disadvantage is a limitation on the ability to sense the output voltage only once per switching cycle and only after the switching in that cycle that increases recovery from, for example, a standby mode.

SUMMARY

Embodiments of the present disclosure herein describe a feedback scheme for non-isolated switching power converters. The switching power converter is configured to provide power to an output load, such as an LED load. The switching power converter can provide power to the output load via a single inductor for buck-boost or buck converters.

An exemplary switching power converter includes a switch, an inductor, a diode, and a controller that generates a control signal to turn on and turn off the switch. The controller generates the control signal by generating a reference signal, integrating a difference between a voltage value of the generated reference signal, and a voltage difference between voltage values of the switching node and the second output terminal, and generating the control signal by processing the integrated voltage difference.

In one embodiment, the controller generates the control signal such that an average voltage value of the output voltage over one or more of the plurality of switching cycles is the same as the voltage value of the reference signal.

In one embodiment, the controller comprises an operational amplifier implemented as an integrator, the operational amplifier integrating a voltage difference between voltages on its inverting input and non-inverting input.

In one embodiment, the controller further comprises a feedback resistor coupled between the inverting input of the operational amplifier and the second output terminal.

In one embodiment, the controller further comprises a current reference coupled between the inverting input of the operational amplifier and the switching node.

In one embodiment, the controller generates the control signal such that an average voltage difference between voltage values of the switching node and the second output terminal is same as a product of a resistance value of the feedback resistor and a current value of the current source.

In one embodiment, the controller further comprises a reference resistor and a voltage reference, the reference resistor coupled between the inverting input of the operational amplifier and the voltage reference, and the voltage reference coupled between the reference resistor and the switching node.

In one embodiment, the controller generates the control signal such that an average voltage difference between voltage values of the switching node and the second output terminal is same as a product of a ratio of resistance values of the feedback resistor and the reference resistors, and a voltage value of the voltage source.

In one embodiment, the controller is further configured to vary a time constant of the integrator without affecting an average voltage value of the output voltage, the time constant varied by changing the resistance value of the feedback resistor and the reference resistor, while keeping a ratio of resistance values of the feedback resistor and the reference resistor constant.

In one embodiment, the operational amplifier of the controller is configured such that the non-inverting input of the operational amplifier is coupled to the switching node for providing a voltage level associated with the switching node as a reference ground voltage of the operational amplifier.

Embodiments also relate to a method of controlling a switching power converter, the switching power converter including a switch coupled between an input terminal for receiving an input voltage and an switching node, an inductor coupled between the switching node and a first output terminal, and a diode coupled between the switching node and a second output terminal, the first and second output terminals configured to provide an output voltage to a load. The method comprises generating a reference signal, integrating a difference between a voltage value of the generated reference signal, and a voltage difference between voltage values of the switching node and the second output terminal, and generating a control signal by processing the integrated voltage difference, the control signal turns on and turns off the switch at each switching cycle of a plurality of switching cycles.

BRIEF DESCRIPTION OF THE DRAWINGS

FIG. 6 is a circuit diagram illustrating a conventional feedback scheme for non-isolated power supplies using high voltage diode.

FIG. 7 is a circuit diagram illustrating a conventional feedback scheme for non-isolated power supplies using high voltage bipolar junction transistor.

DETAILED DESCRIPTION

The Figures (FIGS.) and the following description relate to various embodiments by way of illustration only. It should be noted that from the following discussion, alternative embodiments of the structures and methods disclosed herein will be readily recognized as viable alternatives that may be employed without departing from the principles discussed herein. Reference will now be made in detail to several embodiments, examples of which are illustrated in the accompanying figures. It is noted that wherever practicable similar or like reference numbers may be used in the figures and may indicate similar or like functionality.

This disclosure describes a feedback scheme for non-isolated power supplies that do not need a high voltage component in the feedback path even when the power supply is operating on high voltages. The feedback scheme is applicable to both buck converters and buck-boost converters. The feedback scheme senses information about the output voltage by processing a voltage across the diode of the buck converter or the buck-boost converter instead of processing the output voltage directly. The scheme takes advantage of an observation that an average value of the voltage across the diode is the same as the output voltage over one or more switching cycles.

The feedback scheme also includes generating a reference signal such that a voltage value of the reference signal is equal to the average voltage across the diode in buck converters and in buck-boost converters. Any difference between the voltage of the generated reference signal and that of the voltage across the diode is integrated and the integrated voltage difference is pulse width modulated to generate a control signal to control on and off time of the switch. By processing the voltage across the diode instead of the output voltage, the information about the output voltage can be obtained continuously. And by referring to a switching node of the buck converter or the buck-boost converter as a negative supply voltage of the controller, the need for active high voltage components in the feedback path is eliminated.

Figure 1:
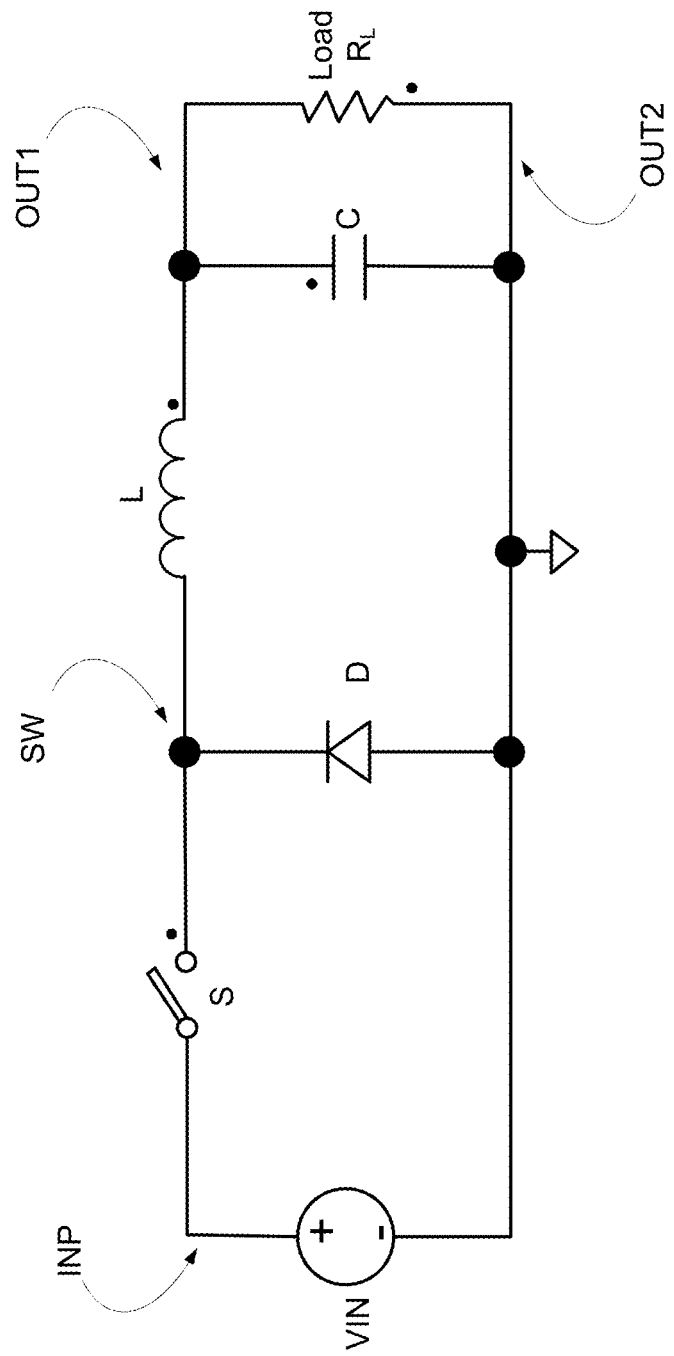
FIG. 1 is a block diagram of a buck converter, according to an example embodiment of the present disclosure.

FIG. 1 illustrates a buck converter according to an example embodiment of the present disclosure. Although the converter 100 of FIG. 1 is a buck converter, it should be noted that present disclosure is not limited to a buck converter and that it can be applied to other converters such as a buck-boost converter. The buck converter 100 includes, among other components, a switch S, an inductor L, a diode D, and a capacitor C. The buck converter 100 receives an input voltage from a DC power supply VIN and outputs an output voltage to a load resistor $R_L$. Throughout the present disclosure the terms "converter" and "power supply" are recited to convey the same meaning and can be used interchangeably.

A buck converter is a non-isolated type of switched-mode power supply that does not include a transformer. The buck converter is voltage step down converter that converts an input voltage to an output voltage, where a voltage value of the output voltage is lower than a voltage value of the input voltage. For example, a 310 V input voltage is converted to a 12V output voltage. The buck converter 100 receives an input DC voltage VIN and outputs a DC output voltage across the load resistor $R_L$. The input DC voltage source VIN is coupled between INP node and OUT2 node, and the load resistor $R_L$ is coupled between OUT1 and OUT2 nodes. The switch S is coupled between INP node and SW node, which can also be referred to as a switching node. The inductor L is coupled between switching node SW and first output node OUT1. The diode is coupled between the switching node SW and the second output node OUT2, with the anode of the diode coupled to OUT2 and the cathode coupled to SW. The capacitor C and load resistor $R_L$ are coupled between first output node OUT1 and second output node OUT2. In one embodiment, OUT2 node is a reference ground voltage for the buck converter. In an example embodiment, the buck converter can receive an AC input voltage (i.e., off-line converter) instead of a DC input voltage. In that scenario, the AC input voltage is first converted into a DC input voltage using known techniques before converting it to a DC output voltage. It is understood that all embodiments described in this disclosure are applicable to both DC-DC converters as well as AC-DC (i.e., off-line) converters.

Figure 2:
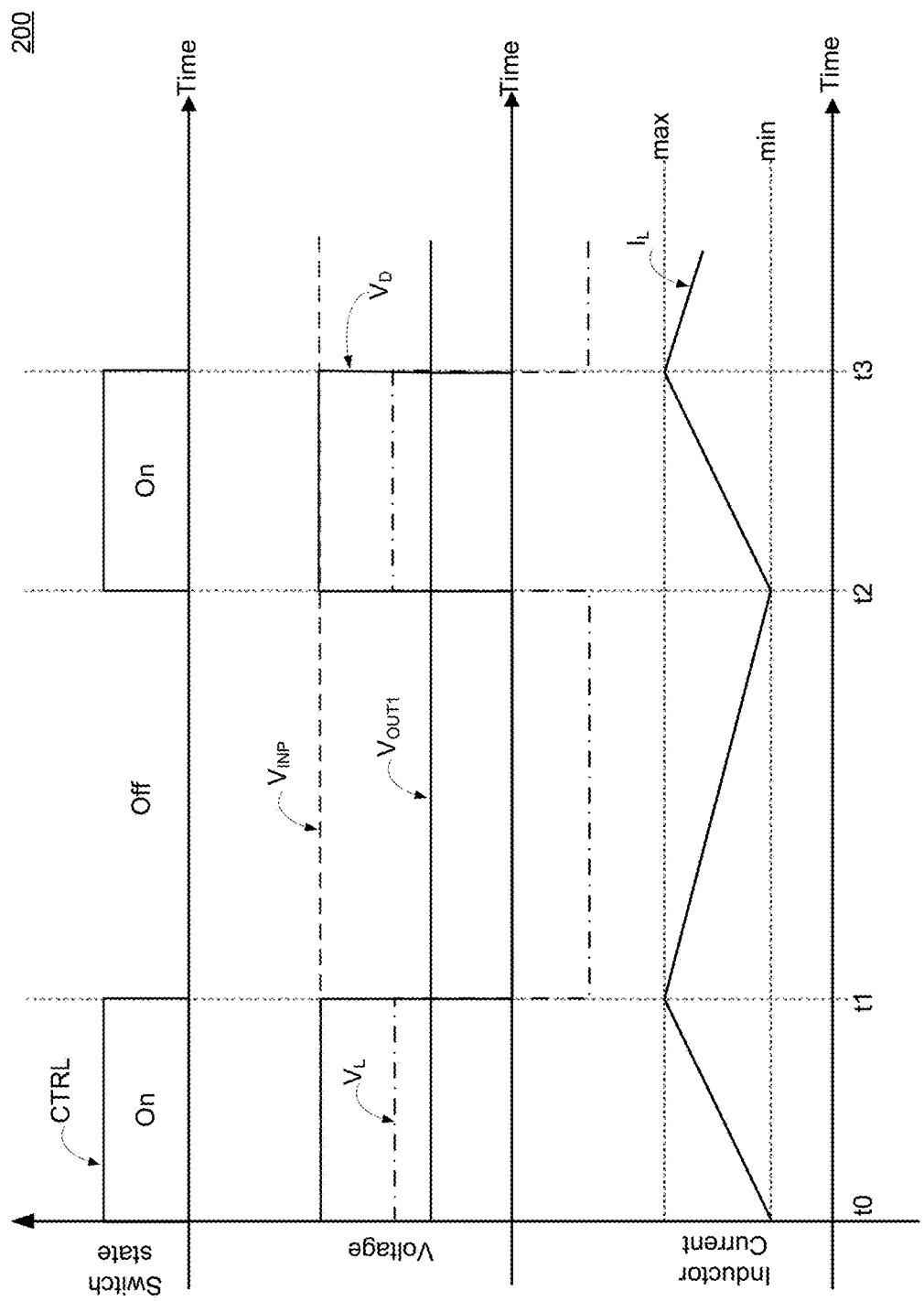
FIG. 2 is a timing diagram illustrating an operation of the buck converter of FIG. 1, according to an example embodiment.

FIG. 2 is a timing diagram illustrating an operation of the buck converter of FIG. 1, according to an example embodiment. In FIG. 2, x-axis represents time and y-axis represents either voltage or current of various signals. Time axis includes various points in time, t0 through t3, represented by vertical dotted lines (line representing t0 overlaps with y-axis). FIG. 2 shows CTRL signal for switching the switch S, voltage $V_L$ across the inductor L, voltage $V_D$ across the diode D, output voltage $V_{OUT1}$ across the load resistor $R_L$, and current $I_L$ through the inductor L. The time period between points t0 and t3 constitutes one switching period for the switch SW. The second output node OUT2 is a reference ground voltage node of the buck converter. FIG. 2 describes an operation of the buck converter when the components of the converter are ideal. It is understood that the principle of operation is equally applicable to non-ideal converters.

An operation of the buck converter 100 is described below along with the timing diagram of FIG. 2. Before point t0, the switch S is open (i.e., in the OFF state) and there is no current flowing in the converter. At point t0, the switch S is closed (i.e., in the ON state) and current $I_L$ flows through the inductor L until the switch S is open again at point t1 as shown in FIG. 2. When switch S is closed, a voltage $V_L$ across the inductor L is given by a difference of voltage values at switching node SW (i.e., $V_{SW}$) and at first output node OUT1 (i.e., $V_{OUT1}$). The voltage $V_L$ across the inductor produces a current flow through the inductor that increases from point t0 to point t1. A value of $V_L$ during the ON state of switch SW (i.e., between points t0 and t1) is equal to a difference between input voltage $V_{INP}$ and output voltage $V_{OUT1}$. The voltage $V_D$ across the diode D is the same as the voltage at the switching node SW. During the ON state, $V_D$ is equal to $V_{INP}$.

At point t1, the switch S is opened and the input voltage source is disconnected in the converter. During this OFF state, the voltage $V_L$ across the inductor decreases and becomes negative as the switching node voltage $V_{SW}$ is zero and the output voltage is still at $V_{OUT1}$. Accordingly, the current $I_L$ flowing through the inductor decreases and the diode is forward biased such that the voltage $V_D$ across the diode is zero (for an ideal diode). The current $I_L$ decreases in value until the switch is closed again at point t2. In an example embodiment implementing a continuous mode of operation depicted in FIG. 2, the inductor current $I_L$ does not reach zero. Alternatively in an embodiment implementing a discontinuous mode of operation, the inductor current $I_L$ does reach zero during the OFF state in each switching cycle. This disclosure is applicable to both a continuous mode and a discontinuous mode operation of buck converters (and buck-boost converters).

The time period between points t0 and t2 constitutes one switching cycle for the switch S while converting an input voltage $V_{INP}$ to an output voltage $V_{OUT1}$. Next at point t2, the switch is closed again until point t3, when it is opened again. It is understood that the switch can be turned ON and OFF for a plurality of switching cycles to convert an input DC voltage to an output DC voltage. A ratio of the period of time the switch is ON compared to a time period of one switching cycle is defined as a duty cycle of the converter operating in a continuous mode of operation. For example, the duty cycle of the buck converter 100 is given by (t1−t0)/(t2−t0). It is important to be able to control the period of time the switch is ON (i.e., duty cycle of the converter in a continuous mode of operation) and FIGS. 3 through 5 describe various feedback techniques that describe the same.

Figure 3:
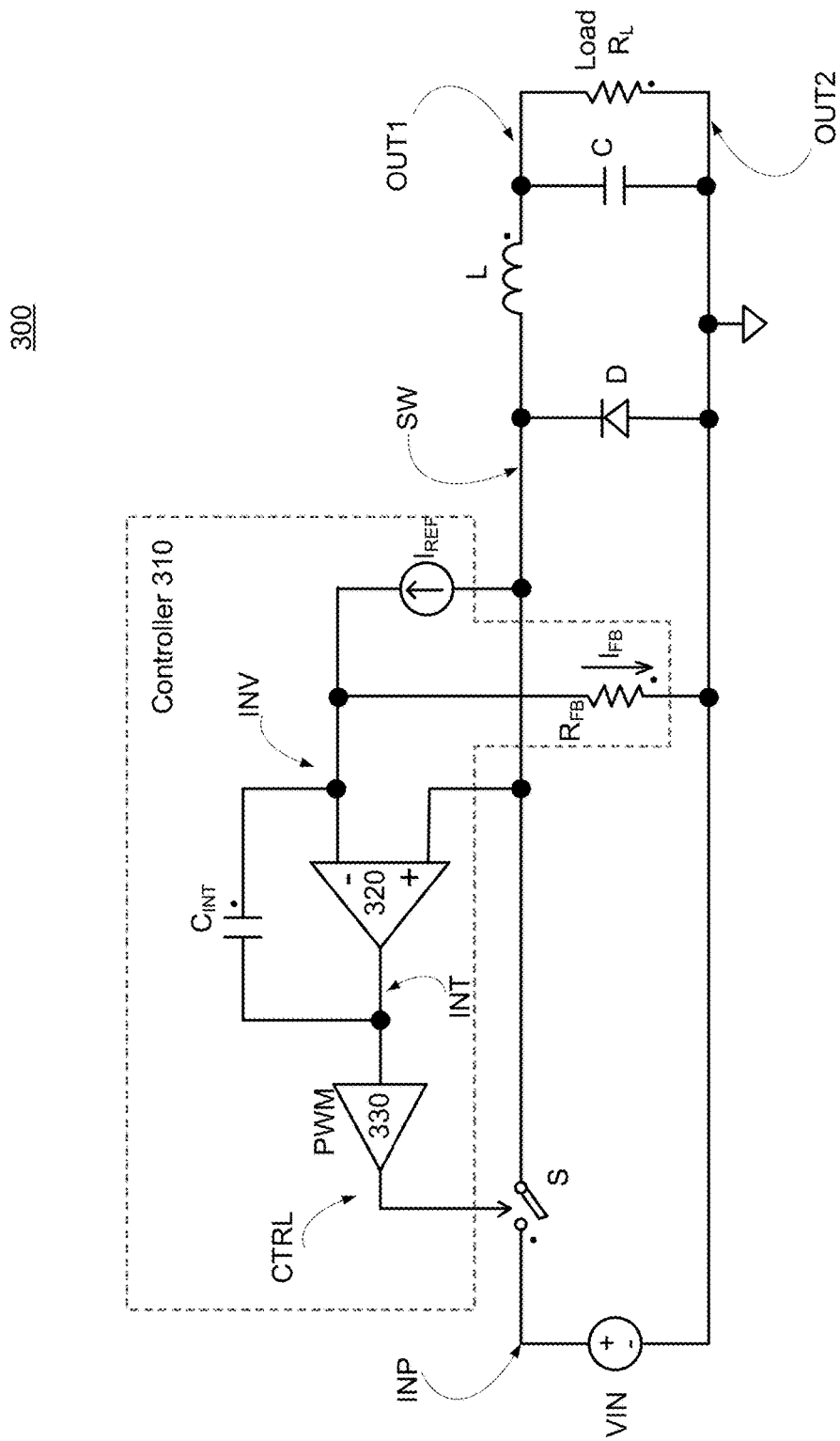
FIG. 3 is a circuit diagram illustrating a feedback scheme for non-isolated power supplies using a current reference, according to an example embodiment.

FIG. 3 is a circuit diagram illustrating a feedback scheme for non-isolated power supplies using current reference, according to an example embodiment. The buck converter 300 shown in FIG. 3 is the same converter 100 described above with reference to FIGS. 1 and 2. Additionally, FIG. 3 shows a controller 310 that controls the ON time of the switch S using a feedback scheme that is described below. The controller 310 includes an operational amplifier (OPAMP) 320 configured to operate as an integrator, a pulse-width modulator (PWM) circuit 330, and circuitry to generate a reference signal. In an example embodiment depicted in FIG. 3, the reference signal is generated using a current reference $I_{REF}$.

The feedback scheme relies on an observation that an average voltage $V_D$ across the diode D is the same as the output voltage across the load resistor $R_L$ over one or more switching cycles of the switch S. Accordingly, the feedback scheme uses this observation and controls the switch S by generating a feedback signal based on the voltage $V_D$ across the diode D instead of the output voltage directly. An example advantage with this feedback scheme is an ability to be able sense the voltage across the diode D continuously instead of being able to sense only once per switching cycle for schemes that are based on the output voltage. Another example advantage is that the proposed feedback scheme is not limited to sensing the output voltage only after switching of the switch S.

The feedback scheme of the converter 300 is described below. The feedback scheme uses a current balance method to create a feedback signal that controls the turning ON and OFF of the switch S. OPAMP 320 is configured to operate as an integrator such that the OPAMP will integrate any difference of voltages across its inverting and non-inverting inputs. The non-inverting input of the OPAMP 320 is coupled to the switching node SW of the converter 300 such that a voltage level at the non-inverting input is the same as a voltage level across the diode D. The inverting input INV of the OPAMP 320 is coupled to the switching node SW through a current reference $I_{REF}$ and to the second output node OUT2 through feedback resistor $R_{FB}$. Capacitor $C_{INT}$ is coupled between the inverting input and an output INT of the OPAMP 320. In an example embodiment, the current reference $I_{REF}$ is generated within the controller 310. Alternatively, $I_{REF}$ is generated external to the converter 300. The resistor $R_{FB}$ can be either integrated within the controller 310 or alternatively can be implemented external to the converter 300.

The OPAMP 320 operates as an integrator in a closed loop configuration, which will ensure that the inverting input of the OPAMP 320 is at a same voltage as the non-inverting input. Accordingly, a voltage across the feedback resistor $R_{FB}$ is going to be the same as that of across the diode D due to the closed loop configuration of the OPAMP 320. Because any current flowing through the non-inverting input of the OPAMP 320 is negligible, the entire current from the current reference $I_{REF}$ flows through the feedback resistor $R_{FB}$. Therefore, the values of $I_{REF}$ and $R_{FB}$ can be chosen such that a product of $I_{REF}$ and $R_{FB}$ would be same as an average voltage difference between voltage values of the switching node SW and the second output node OUT2. In a buck converter, the average voltage difference between voltage values of the switching node SW and the second output node OUT2 is the voltage $V_D$ across diode D. An average voltage difference between voltage values of the switching node SW and the second output node OUT2 is same as the output voltage, as detailed above. The integrator would integrate any voltage difference between the OPAMP's inverting and non-inverting inputs using the integrating capacitor $C_{INT}$, and generates an output $V_{INT}$. In other words, the integrator integrates a difference between a voltage value of the reference signal (i.e., $I_{REF}*R_{FB}$), and a voltage difference between voltage values of the switching node SW and the second output node OUT2. When the feedback loop reaches a steady-state mode of operation, the switch S is controlled such that the output voltage across the load (and diode voltage $V_D$) is the same as the voltage of the reference signal.

The output signal of the integrator $V_{INT}$ is then processed by the PWM circuit 330 to generate a control signal CTRL that controls the switching of the switch S by controlling the ON time of the switch S. The controller 310 controls the switch such that an average voltage value of the output voltage (or an average voltage across diode D) over one or more plurality of switching cycles is the same as the voltage value of the reference signal.

The feedback loop's operation for an example buck converter can be described as below. In an example scenario when the output voltage is larger than its designed value at the steady-state operation, the average diode voltage $V_D$ will also be larger than the voltage value of the reference signal (i.e., $I_{REF}*R_{FB}$). In such example scenario, the integrated output voltage $V_{INT}$ reduces from its steady-state value. A reduced $V_{INT}$ will result in a reduced ON time for the CTRL signal controlling switch S, which in turn will reduce the output voltage and its corresponding diode voltage $V_D$. The feedback loop will keep reducing the output voltage (and diode voltage $V_D$) in each of the switching cycles until the output voltage reaches its steady-state value where an average value of the diode voltage $V_D$ is the same as the voltage value of the reference signal.

Alternatively, when the output voltage is smaller than its designed value at the steady-state operation, the diode voltage $V_D$ will also be smaller than the voltage value of the reference signal (i.e., $I_{REF}*R_{FB}$). In such example scenario, the integrated output voltage $V_{INT}$ increases from its steady-state value. An increased $V_{INT}$ will result in an increased ON time for the CTRL signal controlling switch S, which in turn will increase the output voltage and diode voltage $V_D$. The feedback loop will keep increasing the output voltage (and diode voltage $V_D$) in each of the switching cycles until the output voltage reaches its steady-state value where an average value of the diode voltage $V_D$ is the same as the voltage value of the reference signal.

One example advantage with the proposed feedback scheme described in FIG. 3 is an ability to be able to sense the voltage across the diode D continuously instead of being able to sense only once per switching cycle for schemes that are based on the output voltage. Conventional feedback schemes (e.g., FIG. 6) that sense output voltage directly are limited to sensing only when current is flowing though the inductor (i.e., $I_L$ is not zero). Accordingly, in a discontinuous mode of operation when the inductor current $I_L$ is zero, the control signal CTRL for the switch S cannot be generated and hence the converter cannot be controlled. This is especially a problem for the discontinuous mode of operation where the inductor current is zero for a significant portion of the switching cycle. Because the proposed scheme uses the switching node as the negative supply voltage of the controller, the control signal can be generated even while the inductor current $I_L$ is zero.

Another example advantage with the proposed feedback scheme described in FIG. 3 is an elimination of any high voltage components in the feedback path. In an example embodiment when the buck converter 300 is operating on high voltages of up to 110V input, conventional feedback schemes used in non-isolated converters sense the output voltage across the load and require expensive high voltage components such as a high voltage diode or a high voltage bipolar junction transistor (BJT) in the feedback path to handle voltages as high as (or even higher to account for switching overshoots) 110V. The proposed feedback scheme operates on voltage $V_D$ across the diode D and uses the switching node SW as a negative supply voltage for the controller 310. By using the switching node SW as the negative supply voltage of the controller, none of the components of the controller 310 including OPAMP 320 and PWM circuit 330 need to handle a high voltage. Accordingly, the proposed feedback scheme eliminates the usage of high voltage components in the feedback path by operating on the diode voltage $V_D$ instead of the output voltage. Other example embodiments for implementing the proposed feedback scheme are described below with reference to FIGS. 4 and 5.

In an example embodiment, the proposed feedback scheme described above with reference to a buck converter of FIG. 3 is also applicable to a buck-boost type converter.

Figure 4:
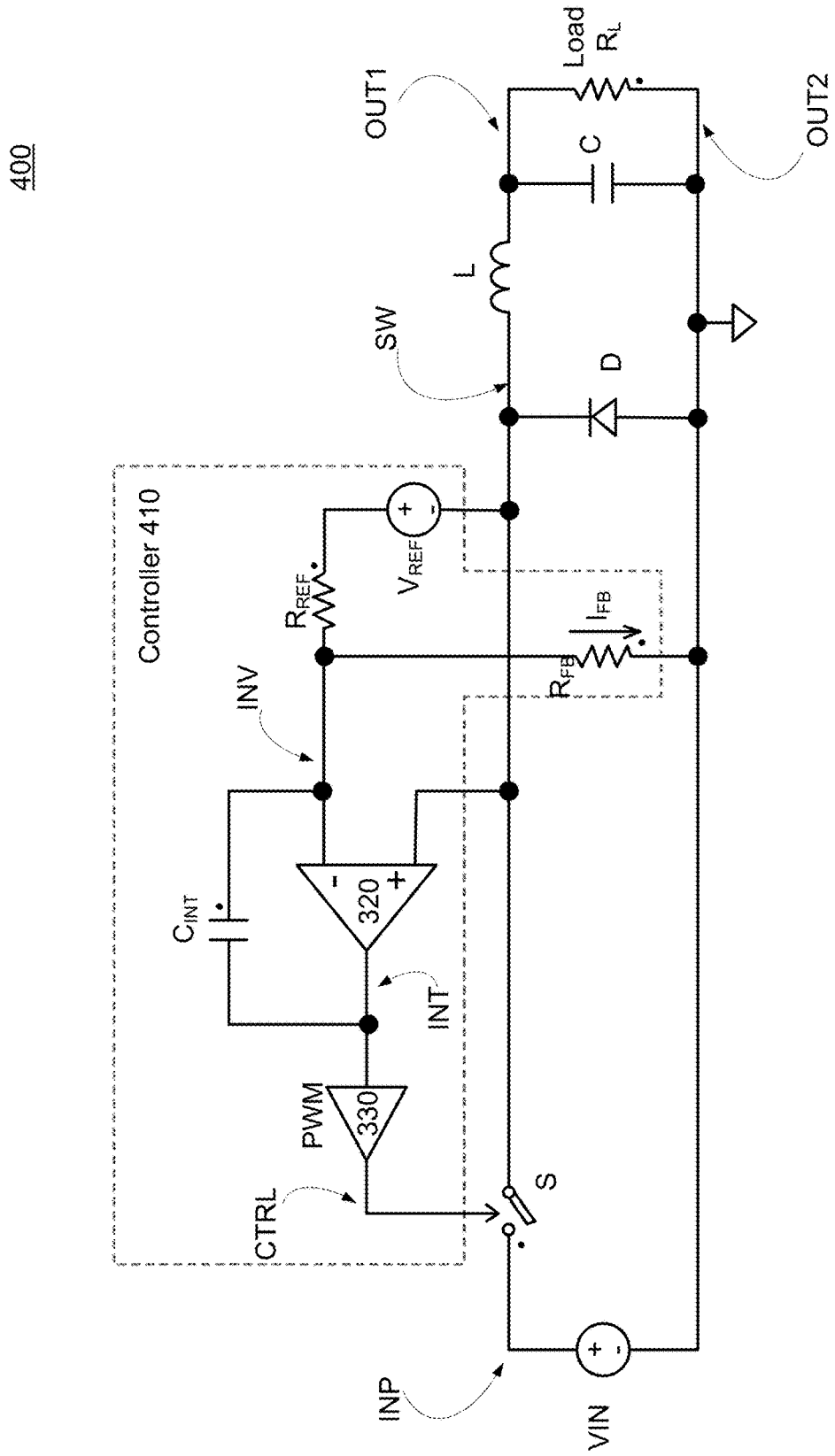
FIG. 4 is a circuit diagram illustrating a feedback scheme for non-isolated power supplies using a voltage reference, according to an example embodiment.

FIG. 4 is a circuit diagram illustrating a feedback scheme for non-isolated power supplies using a voltage reference, according to an example embodiment. The buck converter 400 shown in FIG. 4 is the same converter 300 described above with reference to FIG. 3 except that the controller 410 uses a voltage source $V_{REF}$ to generate the reference signal. In some example embodiments, integrating a precision current source in to an integrated circuit is relatively difficult. One way to avoid implementing a current source reference is to implement a voltage source and a reference resistor as shown in FIG. 4. The below description of FIG. 4 refers to only the differences between FIGS. 3 and 4, namely the generation of reference signals by using a current source $I_{REF}$ in FIG. 3, and a voltage source $V_{REF}$ and reference resistor $R_{REF}$ in FIG. 4. It is understood that all other aspects described above with reference to FIG. 3 are equally applicable to converter of FIG. 4.

Controller 410 includes OPAMP 320, PWM circuit 330, and voltage reference $V_{REF}$ and resistor $R_{REF}$ for generating a reference signal. The non-inverting input of the OPAMP 320 is coupled to the switching node SW of the converter 400 such that a voltage level at the non-inverting input is the same as a voltage level across the diode D. The inverting input INV of the OPAMP 320 is coupled to the switching node SW through a reference resistor $R_{REF}$ and a voltage reference $V_{REF}$, and to the second output node OUT2 through feedback resistor $R_{FB}$. In an example embodiment, the current reference $V_{REF}$ is generated within the controller 410. Alternatively, $V_{REF}$ is generated external to the converter 400. The resistors $R_{FB}$ and $R_{REF}$ can be either integrated within the controller 410 or alternatively can be implemented external to the converter 400.

Controller 410 implements the proposed feedback scheme by first generating a reference signal that is based on the voltage source $V_{REF}$, the reference resistor $R_{REF}$, and the feedback resistor $R_{FB}$. A voltage value of the reference signal is a voltage value across the feedback resistor $R_{FB}$ that is given by a product of a voltage value of $V_{REF}$ and a ratio of resistor values of $R_{FB}$ and $R_{REF}$ (i.e., $V_{REF}*R_{FB}/R_{REF}$). Once the reference signal is generated, the rest of the proposed feedback scheme is implemented similar to the scheme described above with reference to FIG. 3, by integrating a difference between the voltage value of the generated reference signal, and a voltage difference between voltage values of the switching node SW and the second output node OUT2 (i.e., a voltage $V_D$ across the diode D). Next, the integrated voltage difference is processed in the PWM circuit to generate a control signal CTRL that controls the switching states of switch S.

One example advantage of the proposed scheme of FIG. 4 using a voltage reference is an ability to vary a time constant of the integrator without affecting the output voltage of the converter. The time constant of the integrator depends on the value of the integrator capacitance $C_{INT}$ and the resistance values of $R_{REF}$ and $R_{FB}$. The voltage reference $V_{REF}$, and resistors $R_{FB}$ and $R_{REF}$ are chosen such that output voltage (and an average diode voltage $V_D$) is same as a product of a voltage value of $V_{REF}$ and a ratio of resistor values of $R_{FB}$ and $R_{REF}$ (i.e., $V_{REF}*R_{FB}/R_{REF}$). That is, while the individual values of $R_{REF}$ and $R_{FB}$ control the time constant of the integrator, the output voltage is controlled by only a ratio of the resistor values. Accordingly, the time constant of the integrator can be varied without affecting an average voltage value of the output voltage, wherein the time constant is varied by changing the resistance value of the feedback resistor and reference resistor, while keeping a ratio of resistance values of the feedback resistor and the reference resistor constant.

Figure 5:
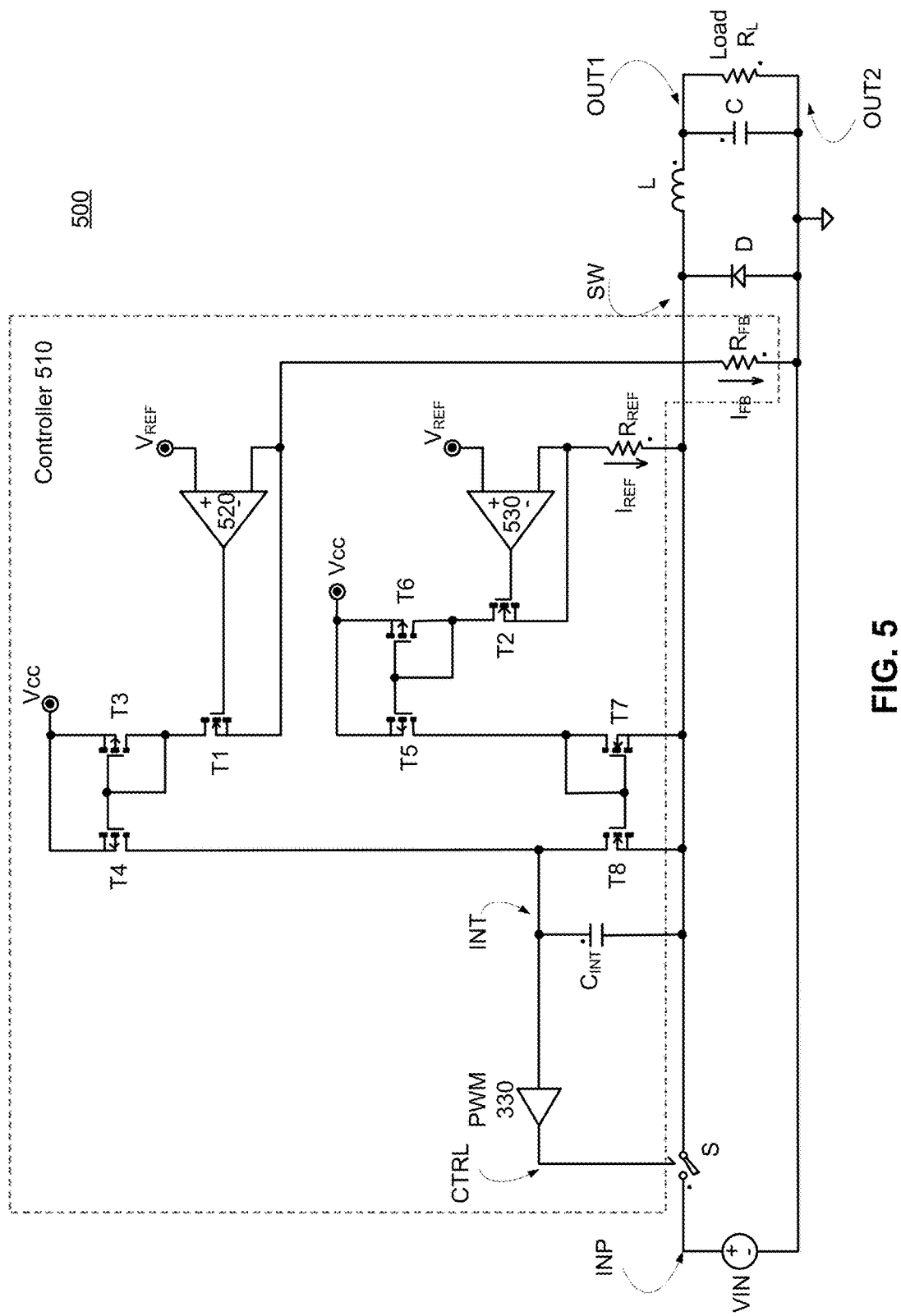
FIG. 5 is a circuit diagram illustrating a feedback scheme for non-isolated power supplies using current mirrors, according to an example embodiment.

FIG. 5 is a circuit diagram illustrating a feedback scheme for non-isolated power supplies using current mirrors, according to an example embodiment. The buck converter 500 shown in FIG. 5 is the same converter 400 described above with reference to FIG. 4 except that the controller 510 implements an integrator by adding offset and current mirrors. In some example embodiments, it is not recommended to have the non-inverting input of the OPAMP to be referenced to the negative supply voltage of the controller. In such embodiments, the integrator can be modified to add offset and current mirrors as shown in FIG. 5. The below description of FIG. 5 refers to only the differences between FIGS. 4 and 5, namely the implementation of the integrator using current mirrors in FIG. 5. It is understood that all other aspects described above with reference to FIG. 4 are equally applicable to converter of FIG. 5.

The integrator of controller 510 is implemented by OPAMP1 520 and OPAMP2 530 and current mirrors using metal-oxide semiconductor (MOS) transistors T3 through T8. The non-inverting inputs of OPAMPS 520 and 530 are referenced to $V_{REF}$ instead of the negative supply voltage of the converter (i.e., switching node of the converter). This implementation of the integrator is an advantageous option in embodiments where the capacitor of the integrator is integrated on-chip. Current mirrors can be scaled by selecting the size of the MOSFETs T3/T4 and T7/T8. One example advantage with the controller 510 over the controller 310 is that a value of the integrator capacitance $C_{INT}$ needed in the controller 510 is much smaller than that of FIG. 3. For example, $C_{INT}$ for controller 310 is about 1 nF and $C_{INT}$ for controller 510 is about 20 pF. It is understood that the feedback scheme to control the switch S of the converter 500 is the same as that of converter 400 except in an implementation of the integrator.

The foregoing description of the embodiments of the disclosure has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of symbolic representations of operations on information. These representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the operations described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Embodiments of the invention may also relate to a computer data signal embodied in a carrier wave, where the computer data signal includes any embodiment of a computer program product or other data combination described herein. The computer data signal is a product that is presented in a tangible medium or carrier wave and modulated or otherwise encoded in the carrier wave, which is tangible, and transmitted according to any suitable transmission method.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A switching power converter comprising:
a switch coupled between an input terminal for receiving an input voltage and a switching node;
an inductor coupled between the switching node and a first output terminal;
a diode coupled between the switching node and a second output terminal, the first and second output terminals configured to provide an output voltage to a load; and
a controller coupled to the switching node, the controller configured to generate a control signal for turning on and turning off the switch at each switching cycle of a plurality of switching cycles of the switch, wherein the controller comprises:
a first operational amplifier to generate a feedback current through a feedback resistor coupled between an input terminal of the first operational amplifier and the second output terminal;
a second operational amplifier to generate a reference current through a reference resistor between an input terminal of the second operational amplifier and the switching node;
a current mirror circuit to mirror the feedback current and the reference current and to generate a control voltage on a control node based on an integrated difference between the feedback current and the reference current;
a switch control circuit to generate the control signal based on the control voltage at the control node.

2. The switching power converter of claim 1, wherein the feedback resistor is coupled between an inverting input of the first operational amplifier and the second output terminal, and wherein a non-inverting input of the first operational amplifier is coupled to a reference voltage.

3. The switching power converter of claim 1, wherein the reference resistor is coupled between an inverting input of the second operational amplifier and the switching node and wherein the non-inverting input of the second operational amplifier is coupled to a reference voltage.

4. The switching power converter of claim 1, wherein the current mirror circuit comprises:
a first current mirror component to mirror the feedback current to generate a mirrored feedback current;
a second current mirror component to mirror the reference current to generate a mirrored reference current;
a third current mirror component to invert the mirrored reference current to generate an inverted mirrored reference current;
an output current path to combine the mirrored feedback current and the inverted mirrored reference current to generate a control current; and
an integrating capacitor coupled between the control node and the switching node to integrate the control current to generate the control voltage.

5. The switching power converter of claim 1, wherein an average voltage of the switching node over one or more of the plurality of switching cycles is controlled to be based on a product of a resistance value of the feedback resistor and a current value of the reference current.

6. The switching power converter of claim 5,
wherein the feedback resistor is coupled between an inverting input of the first operational amplifier and the ground terminal of the switching power converter, and wherein a non-inverting input of the first operational amplifier is coupled to a reference voltage,
wherein the reference resistor is coupled between an inverting input of the second operational amplifier and the switching node and wherein the non-inverting input of the second operational amplifier is coupled to a reference voltage, and
wherein an average of the voltage on the switching node over the plurality of switching cycles is based on a product of a ratio of resistance values of the feedback resistor and the reference resistor, and a voltage value of the reference voltage.

7. The switching power converter of claim 1, wherein the switch control circuit comprises a pulse width modulation controller.

8. A controller circuit for a switching power converter, the controller circuit comprising:
a first operational amplifier to generate a first current through a feedback resistor coupled between an input terminal of the first operational amplifier and a ground terminal of the switching power converter;
a second operational amplifier to generate a reference current through a reference resistor between an input terminal of the second operational amplifier and a switching node, the switching node coupled to a switch of the switching power converter to receive an input voltage of the switching power converter when the switch is closed;
a current mirror circuit to mirror the feedback current and the reference current and to generate a control voltage on a control node based on an integrated difference between the feedback current and the reference current; and
a switch control circuit to generate a control signal for controlling the switch based on the control voltage at the control node.

9. The controller circuit of claim 8, wherein the feedback resistor is coupled between an inverting input of the first operational amplifier and the ground terminal of the switching power converter, and wherein a non-inverting input of the first operational amplifier is coupled to a reference voltage.

10. The controller circuit of claim 8, wherein the reference resistor is coupled between an inverting input of the second operational amplifier and the switching node and wherein the non-inverting input of the second operational amplifier is coupled to a reference voltage.

11. The controller circuit of claim 8, wherein the current mirror circuit comprises:
a first current mirror component to mirror the feedback current to generate a mirrored feedback current;
a second current mirror component to mirror the reference current to generate a mirrored reference current;
a third current mirror component to invert the mirrored reference current to generate an inverted mirrored reference current;
an output current path to combine the mirrored feedback current and the inverted mirrored reference current to generate a control current; and
an integrating capacitor coupled between the control node and the switching node to integrate the control current to generate the control voltage.

12. The controller circuit of claim 8, wherein the controller controls an average voltage of the switching node over one or more of the plurality of switching cycles to be based on a product of a resistance value of the feedback resistor and a current value of the reference current.

13. The controller circuit of claim 12,
wherein the feedback resistor is coupled between an inverting input of the first operational amplifier and the ground terminal of the switching power converter, and wherein a non-inverting input of the first operational amplifier is coupled to a reference voltage,
wherein the reference resistor is coupled between an inverting input of the second operational amplifier and the switching node and wherein the non-inverting input of the second operational amplifier is coupled to a reference voltage, and
wherein an average of the voltage on the switching node over the plurality of switching cycles is based on a product of a ratio of resistance values of the feedback resistor and the reference resistor, and a voltage value of the reference voltage.

14. The controller circuit of claim 8, wherein the switch control circuit comprises a pulse width modulation controller.

15. A method for controlling a switching power converter having a switch coupled between an input terminal and a switching node, an inductor coupled between the switching node and a first output terminal, a diode coupled between the switching node and a second output terminal, the method comprising:
generating, by a first operational amplifier, a feedback current through a feedback resistor coupled between an input terminal of the first operational amplifier and the second output terminal;
generating, by a second operational amplifier, a reference current through a reference resistor between an input terminal of the second operational amplifier and the switching node;
mirroring, by a current mirror circuit, the feedback current to generate a mirrored feedback current and mirroring, by the current mirror circuit, the reference current to generate a mirrored reference current;
integrating, by an integrating circuit, a difference between the mirrored feedback current and the mirrored reference current to generate a control voltage; and
generating, by a switching control circuit, a control signal to control switching of the switch.

16. The method of claim 15, wherein the feedback resistor is coupled between an inverting input of the first operational amplifier and the second output terminal, and wherein a non-inverting input of the first operational amplifier is coupled to a reference voltage.

17. The method of claim 15, wherein the reference resistor is coupled between an inverting input of the second operational amplifier and the switching node and wherein the non-inverting input of the second operational amplifier is coupled to a reference voltage.

18. The method of claim 15, wherein integrating the difference between the mirrored feedback current and the mirrored reference current comprises:
inverting, by a inverting current mirror circuit, the mirrored reference current to generate an inverted mirrored reference current;
combining the mirrored feedback current and the inverted mirrored reference current to generate a control current; and integrating, by a capacitor, the control current to generate the control voltage.

19. The method of claim 15, wherein controlling switching of the switch comprises:

controlling an average voltage of the switching node over one or more of the plurality of switching cycles to be based on a product of a resistance value of the feedback resistor and a current value of the reference current.

20. The method of claim 19, wherein the feedback resistor is coupled between an inverting input of the first operational amplifier and the ground terminal of the switching power converter, and wherein a non-inverting input of the first operational amplifier is coupled to a reference voltage, wherein the reference resistor is coupled between an inverting input of the second operational amplifier and the switching node and wherein the non-inverting input of the second operational amplifier is coupled to a reference voltage, and wherein controlling switching of the switch comprises controlling an average of the voltage on the switching node over the plurality of switching cycles based on a product of a ratio of resistance values of the feedback resistor and the reference resistor, and a voltage value of the reference voltage.

* * * * *